United States Patent
Kwak et al.

(10) Patent No.: US 6,218,296 B1
(45) Date of Patent: Apr. 17, 2001

(54) SEMICONDUCTOR DEVICE WITH PILLAR-SHAPED CAPACITOR STORAGE NODE AND METHOD OF FABRICATING THE SAME

(75) Inventors: Dong-Hwa Kwak, Suwon; Yoo-Sang Hwang, Kyunggi-do; Tae-Young Chung, Suwon, all of (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/346,922

(22) Filed: Jul. 2, 1999

(30) Foreign Application Priority Data

Jul. 3, 1998 (KR) .................................................. 98-26916

(51) Int. Cl.⁷ .................................................. H01L 21/44
(52) U.S. Cl. .................... 438/653; 438/253; 438/254; 438/3; 438/396; 438/397; 438/652; 438/654; 438/655; 438/666; 438/667; 438/608; 438/686
(58) Field of Search .................... 438/253, 254, 438/396, 397, 3, 653, 686, 608, 652, 654, 655, 656, 657

(56) References Cited

U.S. PATENT DOCUMENTS

| | | | |
|---|---|---|---|
| 5,489,548 | * | 2/1996 | Nishioka et al. ........................ 437/60 |
| 5,506,166 | * | 4/1996 | Sandhu et al. ......................... 437/60 |
| 5,637,527 | * | 6/1997 | Baek ..................................... 438/396 |
| 5,677,227 | * | 10/1997 | Yang et al. ............................ 437/60 |
| 5,714,402 | * | 2/1998 | Choi ...................................... 437/60 |
| 5,792,687 | * | 8/1998 | Jeng et al. ............................ 438/253 |
| 5,851,896 | * | 12/1998 | Summerfelt ........................... 438/396 |
| 5,920,777 | * | 7/1999 | Choi et al. ............................ 438/257 |
| 5,994,197 | * | 11/1999 | Liao ..................................... 438/396 |
| 5,998,250 | * | 12/1999 | Andricacos et al. ................. 438/240 |
| 6,025,223 | * | 2/2000 | Park ..................................... 438/240 |

* cited by examiner

Primary Examiner—John F. Niebling
Assistant Examiner—Jennifer M. Kennedy
(74) Attorney, Agent, or Firm—The Law Offices of Eugene M. Lee, PLLC

(57) ABSTRACT

A semiconductor device and a method for making a semiconductor device having a pillar-shaped capacitor storage node compatible with a high dielectric film, wherein the pillar-shaped capacitor storage node includes a thick conductive metal layer that is easily etched and a thin conductive layer completely coating the thick conductive metal layer. The thin conductive layer protects the thick conductive metal layer during subsequent high dielectric deposition and annealing and various oxidation process.

19 Claims, 4 Drawing Sheets

SEMICONDUCTOR DEVICE WITH PILLAR-SHAPED CAPACITOR STORAGE NODE AND METHOD OF FABRICATING THE SAME

BACKGROUND OF THE INVENTION

1. Field of the Invention

The present invention relates to a semiconductor device and a method of manufacturing such a device. More particularly, the present invention relates to a semiconductor device having a pillar-shaped capacitor storage node having a high dielectric film and a method for manufacturing such a device.

2. Background of the Invention

Conventional dynamic random access memory (DRAM) devices include storage nodes, which storage nodes typically include a capacitor. As DRAM devices are scaled down to a line width dimension of about a quarter micrometer, two-dimensional areas occupied by the capacitor become smaller and smaller. Despite reduced cell areas, capacitors require a minimum level of capacitance of about 25 fF to 30 fF. Many methods have therefore been developed to maintain a desired capacitance from decreased two-dimensional areas.

One approach is to increase the height of the capacitor so as to increase the available cell surface areas. The increase in the height of the capacitor at the cell array region, however, causes a large step between the cell array region and peripheral region, thus making it difficult to form metal interconnections.

An alternative approach is to increase the dielectric constant of the dielectric film of the capacitor. Recently, high dielectric materials such as strontium titanate ($SrTiO_3$), barium-strontium titanate (($Ba•St)TiO_3$), and the like, having a dielectric constant of more than 10,000, have been adopted as a dielectric film instead of the conventional silicon nitride ($Si_3N_4$) and tantalum oxide ($Ta_2O_5$). However, when the polysilicon is used as a capacitor storage node, a layer of low dielectric characteristics, such as $SiO_2$ (silicon oxide layer) is formed at the interface between the polysilicon layer and the high dielectric film, thereby increasing the leakage current of the high dielectric film.

Accordingly, there is a need for a storage node that is compatible with high dielectric materials, but which does not degrade the high dielectric characteristics. Because platinum is unreactive with a high dielectric layer during deposition and post-deposition annealing of the high dielectric layer, platinum has been employed as a capacitor storage node when the dielectric film is comprised of a high dielectric material, such as strontium titanate and barium-strontium titanate. However, there are some problems associated with the use of platinum in highly integrated circuit devices. For example, when applied to a process for forming a storage node with about 0.1 to 0.2 micrometers spacing, etched platinum is left on the sidewalls of the patterned storage node. This may occur because it is difficult to form volatile etching by-products during dry etching of the platinum, and so etching by-products remain. As a result, the final storage node has a sloped sidewall profile, and such a sidewall profile can be a serious obstacle to achieving fine pattern size. Also, in severe cases, an electrical bridge may arise between adjacent storage nodes.

The present invention is directed to overcoming or at least reducing the effects of one or more of the problems set forth above.

SUMMARY OF THE INVENTION

In accordance with one aspect of the invention there is provided a semiconductor device that includes a pillar-shaped capacitor storage node of a capacitor with a substantially vertical sidewall profile. The pillar-shaped storage node is made of a first barrier metal layer, a first thick conductive layer formed on the first barrier metal layer, a second barrier metal layer formed on the first conductive layer, a second thin conductive layer formed on the second barrier metal layer, a barrier metal spacer formed on both sidewalls of the pillar-shaped storage node, and a conductive spacer formed on both sidewalls of the barrier metal spacer.

According to one feature of the invention, the first thick conductive layer is made of a material that is easily etched by anisotropic dry etching. Preferably, titanium nitride layer and polysilicon may be formed thickly to increase available surface area.

According to another feature of the invention, the second thin conductive layer is made of a transition metal that is unreactive with a later-formed high dielectric material. This transition metal is advantageously formed thinly so as to prevent the formation of an electrical bridge between adjacent storage nodes. The first barrier layer prevents reaction between a polysilicon plug and the first thick conductive layer. The second barrier layer prevents reaction between the first conductive layer and second conductive layer and thereby prevents oxidation of the first conductive layer.

Preferably, the first and second barrier metals are made of a material selected from the group consisting of TiN, TiAlN, TiSiN, TaSiN, TaAlN, ruthenium oxide, iridium oxide, lanthanum strontium cobalt oxide, and a conductive oxide of barium, strontium or ruthenium. Preferably, the thin second conductive layer is made of a material selected from the group consisting of polysilicon, ruthenium and a titanium nitride layer. Preferably, the second conductive layer is made of a material selected from a group consisting of ruthenium, platinum, iridium oxide, ruthenium oxide, lanthanum strontium cobalt oxide, and a conductive oxide of barium, strontium or ruthenium.

Sidewall spacers are provided to protect already-formed layers during subsequent high dielectric deposition and following various heat treatment.

More specifically, the pillar-shaped storage node is formed by the following process sequence. First, a transistor is formed on an active region of a semiconductor substrate. The active region is surrounded by an insulator, i.e., field oxide layer. An insulating layer is formed on the resulting structure. Contact is opened in the insulating layer to a desired portion of the active region. A conductive material such as polysilicon is deposited in the contact opening and on the insulating layer and then planarized to form a polysilicon contact plug therein.

In accordance with another aspect of the invention, there is provided a method of manufacturing such a semiconductor device. In accordance with this method, a first barrier metal layer is formed on the insulating layer and on the polysilicon plug. The first barrier layer serves to prevent reaction between the polysilicon plug and later-formed conductive layers. A first conductive layer is deposed on the first barrier metal layer. The first conductive layer is formed thickly to increase available surface area which is directly related to the capacitance. A conductive material that is easily etched through anisotropic dry etching is selected as such. Preferably, polysilicon or titanium nitride layer may be formed to a thickness of about 1,000 Å to 10,000 Å.

A second barrier layer is formed on the first conductive layer to a thickness of about 100 Å to 1,000 Å. A second conductive layer is then formed on the second barrier metal layer. The second conductive layer is made of a material that is unreactive with later-formed high dielectric materials. Preferably, the second conductive layer is made of a material selected from the group consisting of ruthenium, platinum, iridium oxide, ruthenium oxide, lanthanum strontium cobalt oxide, and a conductive oxide of barium, strontium or ruthenium. The second-conductive layer is formed thinly, preferably, to a thickness of about 100Å to 1,000Å in order to avoid slope etch thereof during anisotropic dry etching.

Using a storage node forming mask, selected portions of the stacked layers are anisotropically etched to form a pillar-shaped storage node. Since the second conductive layer is formed thinly, slope etching thereof can be avoided, thereby forming sidewalls having substantial vertical profiles. Moreover, the first conductive layer that is easily etched is formed thickly and thus advantageously increases available surface of the storage node.

To protect the exposed sidewalls of the first conductive layer, a barrier metal spacer is formed on the sidewalls of the pillar-shaped storage node with the same material as the first and second barrier metal layer. Another sidewall spacer is formed to completely coat the resulting structure with the same material as the second conductive layer that is unreactive with a later-formed high dielectric layer.

Subsequently, a high dielectric layer and a plate node are formed to complete a capacitor with increased capacitance.

According to yet another aspect of the invention, there is provided a pillar-shaped storage node including a first conductive layer, a second conductive layer formed on the first conductive layer, and a side wall spacer formed on both the sidewalls of the first and second conductive layers. The first conductive layer is at least three times as thick as the second conductive layer. The first conductive layer is made of a material that is easily etched by anisotropic dry etching. The first conductive layer is formed thickly to increase available surface area. The second conductive layer is made of a material that is unreactive with later-formed high dielectric materials and formed thinly in order to avoid slope etching thereof.

DESCRIPTION OF THE DRAWINGS

The above features and advantages of the invention will become apparent upon reference to the following detailed description of specific embodiments and the attached drawings, of which.

DESCRIPTION OF SPECIFIC EMBODIMENTS

Figure 1A:
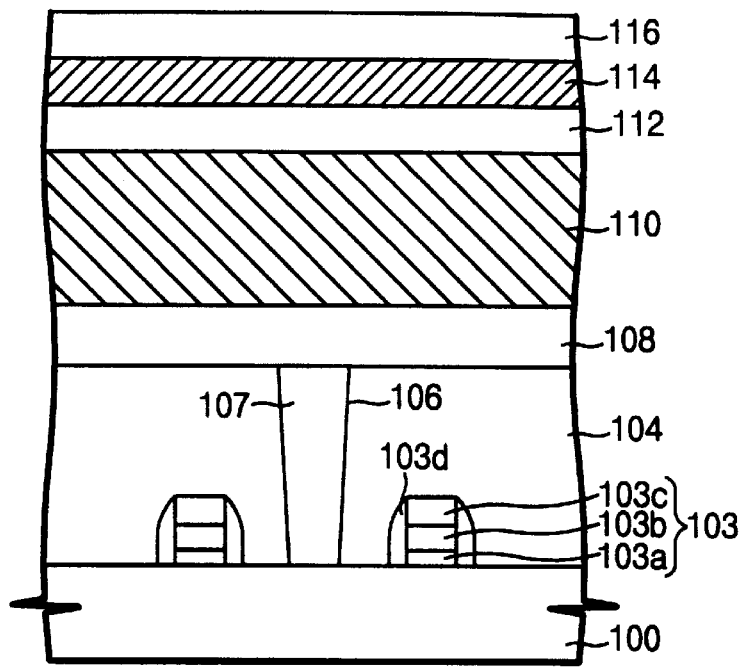
FIGS. 1A to 1D are cross-sectional views of a semiconductor device illustrating a method for fabricating a pillar-shaped capacitor storage node according to a first embodiment of the present invention.

Korean Patent Application No. 98-26916, filed on Jul. 3, 1998, is hereby incorporated by reference in its entirety as if fully set forth herein.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art.

In the drawings, the thickness of layers and regions are exaggerated for clarity. It will also be understood that when a layer is referred to as being "on" another layer or substrate, it can be directly on the other layer or substrate or intervening layers may also be present. In contrast, when an element is referred to as being "directly on" another element, there are no intervening elements present.

The present invention relates to a pillar-shaped capacitor storage node that can provide increased capacitance with the use of high dielectric material, and a method for making such device.

Referring now to FIG. 1A, a field oxide layer(not shown) is formed on a semiconductor substrate 100 to define an active region. An active region is a portion of the substrate to which electrical connections are applied. The field oxide layer surrounds each active region and electrically isolates the active regions from one another. Transistors are formed on active regions in a conventional manner. Each transistor includes a gate oxide layer(not shown), a gate electrode 103, side wall spacers 103d, and a pair of source/drain regions (not shown). The gate electrode 103 is comprised of a polysilicon layer 103a, a silicide layer 103b, and a silicon nitride layer 103c.

An insulating layer 104, for example, a BPSG (Boro-Phospho-Silicate Glass) layer, a USG (Undoped Silicate Glass) layer, or the like, is formed on the semiconductor substrate 100, including the region of the substrate on which the transistor is formed. Though not shown, a bit line is formed in the insulating layer 104 and is electrically connected to one of the source and drain regions of the transistor. Preferably, a first oxide layer is formed on the semiconductor substrate, including the region on which the transistor is formed. A selected portion of the first oxide layer is etched to form a contact hole for the bit line. The contact hole for the bit line is filled with a conductive material and patterned to form a desired bit line. Subsequently, a second planar oxide layer is formed on the resulting structure.

Also shown in FIG. 1A is a contact plug 107 for a storage node. The contact plug 107 may be formed as follows. A selected portion of the insulating layer 104 is etched to form a contact hole 106 for the storage node. The resulting contact hole 106 is then filled with a conductive material, such as polysilicon. This structure is then planarized to form a contact plug 107 that is electrically isolated from adjacent contact plugs (not shown). Planarization may be accomplished using CMP (chemical mechanical polishing) or an etch-back process.

After formation of the contact plug 107, a first barrier layer 108, a first conductive layer 110, a second barrier layer 112 and a second conductive layer 114 are sequentially formed. The first barrier layer 110 is provided to prevent oxidation of the polysilicon contact plug 107. The first barrier layer may be made of a material selected from the group consisting of TiN, TiAlN, TiSiN, TaSiN, TaAlN, ruthenium oxide, iridium oxide, lanthanum strontium cobalt oxide and a conductive oxide of barium, strontium and ruthenium.

The first conductive layer 110 is made of a material that is easily etched by anisotropic dry etching. For example, a polysilicon, titanium nitride or ruthenium layer may be used. This first conductive layer 110 is formed thickly, preferably, to a thickness of about 1,000 Å to 10,000 Å so as to increase available surface areas of storage node.

The second barrier metal layer 112 is provided to prevent the reaction between the first conductive layer 110 and the later-formed second conductive layer 114, thus preventing oxidation of the first conductive layer 110. The second barrier metal layer may comprise a material selected from the group consisting of TiN, TiAlN, TiSiN, TaSiN, TaAlN, ruthenium oxide, iridium oxide, lanthanum strontium cobalt oxide and conductive oxide of barium, strontium or ruthenium. The second barrier metal layer 112 is formed to a thickness of about 100 Å to 1,000 Å.

The second conductive layer 114 is made of a material that is unreactive with a, later-formed high dielectric material. Such material preferably is a transition metal, including ruthenium, platinum, iridium oxide, ruthenium oxide, lanthanum strontium cobalt oxide and conductive oxide of barium, strontium or ruthenium. However, such transition metals may give rise to the problem of slope etching by anisotropic dry etching. Accordingly, in accordance with the present invention, a transition metal that is unreactive with a high dielectric material (that is, a material with a high dielectric constant as noted in the background of the invention) is used to form a very thin layer, preferably, to a thickness of about 100Å to 1,000Å.

A first mask layer 116 is formed on the second conductive layer 114 to a thickness of about 500Å to 5,000Å. The first mask layer 116 is made of a double layer comprising a Ti or TiN layer and an oxide layer. While not shown in FIG. 1A, a second mask layer is formed on the first mask layer 116. The second mask layer may be a single photoresist layer or a multi-layer resist layer. If a single photoresist layer is formed, the deposited photoresist layer is patterned into a configuration layer. The underlying first mask layer 116 is then etched to form a mask pattern using the single patterned photoresist layer. If a multi-layer resist layer is used, the multi-layer resist layer includes a bottom photoresist layer, an intermediate oxide layer and a top photoresist layer. In this case, the top photoresist layer is patterned, and using the patterned top photoresist layer, the oxide layer, the bottom photoresist layer and the first mask layer are etched to form a mask pattern with a multi-layer structure.

Figure 1B:
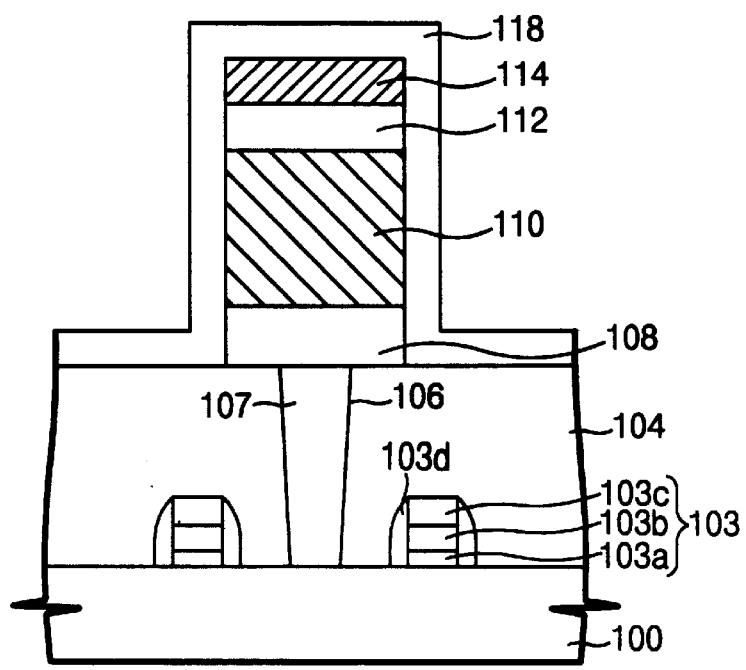

In either case, after removing the patterned photoresist, using the mask pattern, the first conductive layer 110, the second conductive layer 114, the first barrier layer 108, and the second barrier layer 112 are etched to form a pillar-shaped storage node that is electrically connected to the contact plug 107 as shown in FIG.1B. When etching the conductive layers and barrier layers, the mask pattern is simultaneously removed while forming the pillar-shaped storage node. More specifically, the oxide layer of the mask pattern is completely removed while concurrently serving as an etching mask with respect to the Ti or TiN layer of the mask pattern, the second conductive layer 114, the second barrier metal layer 112 and the first conductive layer 110. The Ti or TiN layer of the mask pattern is completely removed while concurrently serving as an etching mask with respect to the first barrier metal layer 108.

It will be appreciated that, as described earlier, because the second conductive layer 114 is formed thinly, the sidewall profile of the pillar-shaped storage node becomes substantially vertical. Such a vertical profile serves to improve step coverage of subsequent high dielectric layers.

Figure 1C:
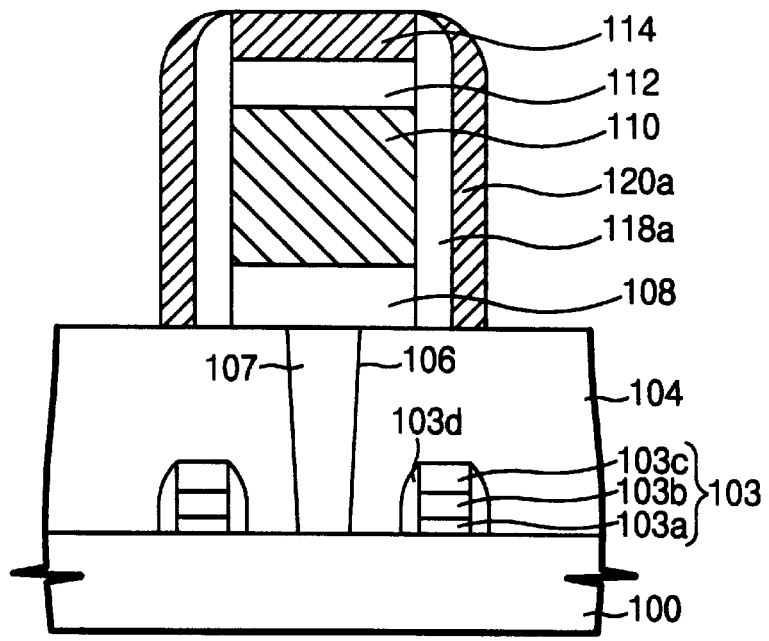

Referring again to FIG.1B, a third barrier metal layer 118 is deposited on the resulting structure. The third barrier metal layer 118 preferably is made of the same material as the first and second barrier metal layer and has a thickness of about 100 Å to 1,000 Å. As shown in FIG. 1C, the deposited third barrier metal layer 118 is then etched back to form a sidewall metal spacer 118a on both sidewalls of the pillar-shaped storage node. The sidewall metal spacer 118a is provided to prevent oxidation of exposed sidewalls of the first conductive layer 110 during the subsequent high dielectric process.

A third conductive layer 120 is then deposited on the resulting structure. The third conductive layer 120 preferably is made of the same material as the second conductive layer 114 that is unreactive with the high dielectric material. Subsequently, the deposited third conductive layer is etched back to form a sidewall conductive spacer 120a on the sidewall metal spacer 118a, thereby completely forming a pillar-shaped storage node, as shown in FIG. 1C. The sidewall conductive spacer 120a serves to prevent oxidation of the sidewall metal spacer 118a.

Figure 1D:
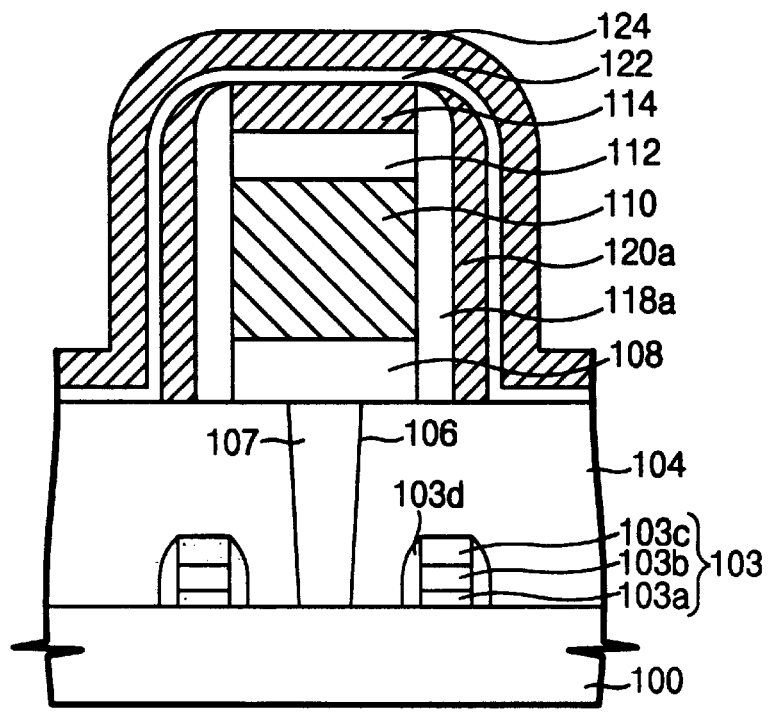

Referring now to FIG. 1D, a high dielectric layer 122 is formed on the resulting structure. Preferably, the high dielectric layer 122 is made of BST, ST, (Barium Strontium Titanate Strontium Titanate) or the like and has a thickness of about 200 Å to 1,000 Å. Subsequently, a plate node 124 is formed on the high dielectric layer 122 to a thickness of about 100 Å to 2,000 Å. The plate node preferably is made of a material selected from the group consisting of platinum, iridium and ruthenium. As a result, a high dielectric capacitor is formed.

It will be appreciated that in the above-mentioned method, the barrier layers 108, 112 and 118 serve not only as reaction barrier layers, but also as components of the storage node.

FIGS. 2A to 2D shows cross-sectional views of a semiconductor substrate at selected stages of a method for forming a pillar-shaped storage node of a capacitor according to a second embodiment of the present invention. Explanation of the corresponding process steps as previously described in reference to FIGS. 1A to 1D is omitted.

Figure 2A:
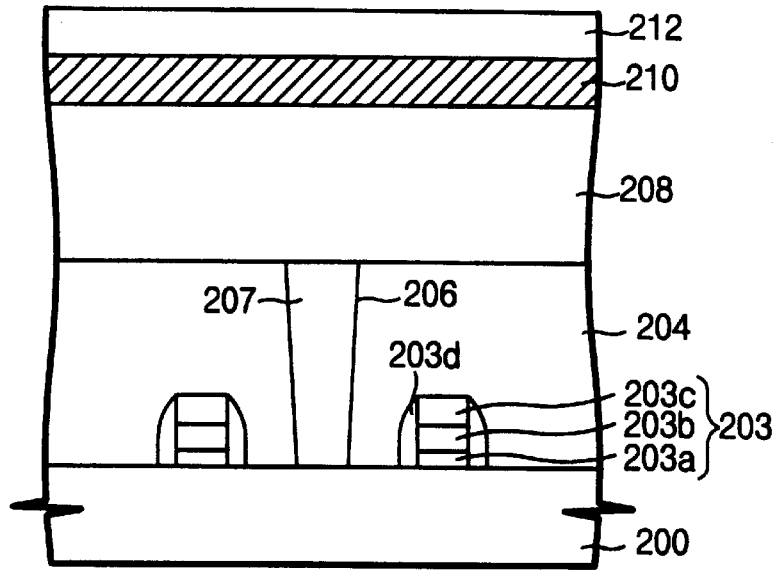
FIGS. 2A to 2D are cross-sectional views of a semiconductor device illustrating a method for fabricating a pillar-shaped capacitor storage node according to a second embodiment of the present invention.
Figure 2B:
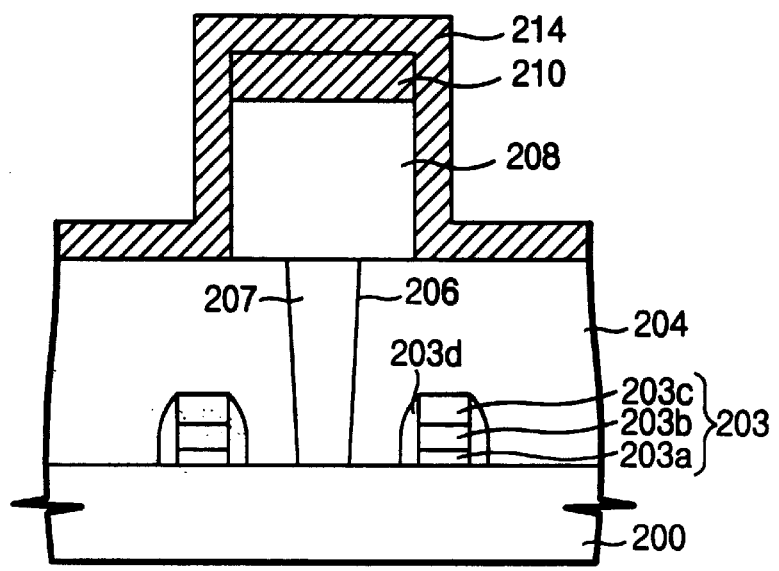

Referring to FIG. 2A, a gate electrode 203 is formed on an active region of a semiconductor substrate 200. The gate electrode 203 includes a polysilicon layer 203a, a silicide layer 203b, a silicon nitride layer 203c and side wall spacers 203d. Formed within the contact hole 206 is a contact plug 207.

After forming the contact plug 207, a first conductive layer 208 is formed on the insulating layer 204 and on the contact plug 207. The first conductive layer 208 is made of a material that is easily etched by anisotropic dry etching, preferably, a material selected from the group consisting of TiN, TiAlN, TiSiN, TaSiN, TaAlN, ruthenium oxide, iridium oxide, lanthanum strontium cobalt oxide and a conductive oxide of barium, strontium or ruthenium. This first conductive layer 208 is formed thickly so as to increase available surface area.

A thin second conductive layer 210 is then formed on the first conductive layer. The second conductive layer 210 is made of a material that is unreactive with a later-formed high dielectric material. Preferably such material is a transition metal, such as ruthenium, platinum, iridium oxide, ruthenium oxide, lanthanum strontium cobalt oxide and a conductive oxide of barium, strontium or ruthenium.

As previously noted, such transition metals may result in slope etching by anisotropic dry etching. Accordingly, in accordance with the present invention, the transition metal that is unreactive with high dielectric material is formed relatively thinly. Preferably, the first conductive layer 208 is at least three times as thick as the second conductive layer 210. For example, the first conductive layer 208 is formed to a thickness of about 1,000 Å to 10,000 Å and the second conductive layer is formed to a thickness of about 300 Å to 2,000 Å.

The first conducive layer 208 also serves to prevent oxidation of the polysilicon plug 207. The second conductive layer 208 is preferably made of a material selected from the group consisting of ruthenium, platinum, iridium oxide, ruthenium oxide, lanthanum strontium cobalt oxide and a conductive oxide of barium, strontium or ruthenium.

After forming the first and second conductive layers 208 and 210, a mask layer 212 is formed thereon. The mask layer 212 is then patterned to form a mask pattern. Using this mask pattern, selected portions of the second and first conductive layers 210 and 208 are etched to form a pillar-shaped storage node that is electrically connected to the contact plug 207 (see FIG.2B).

Figure 2C:
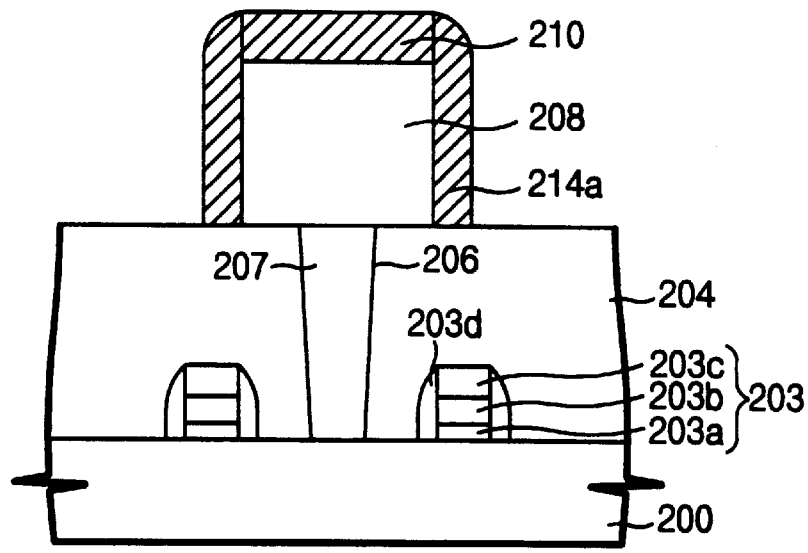

A third conductive layer 214 is deposited and etched back to form a sidewall conductive spacer 214a, as shown in FIG. 2C. The spacer 214a serves to prevent oxidation of the first conductive layer 208 during a subsequent high dielectric process and various oxidation processes. The third conductive layer 214 may be made of the same material as the second conductive layer 210.

Figure 2D:
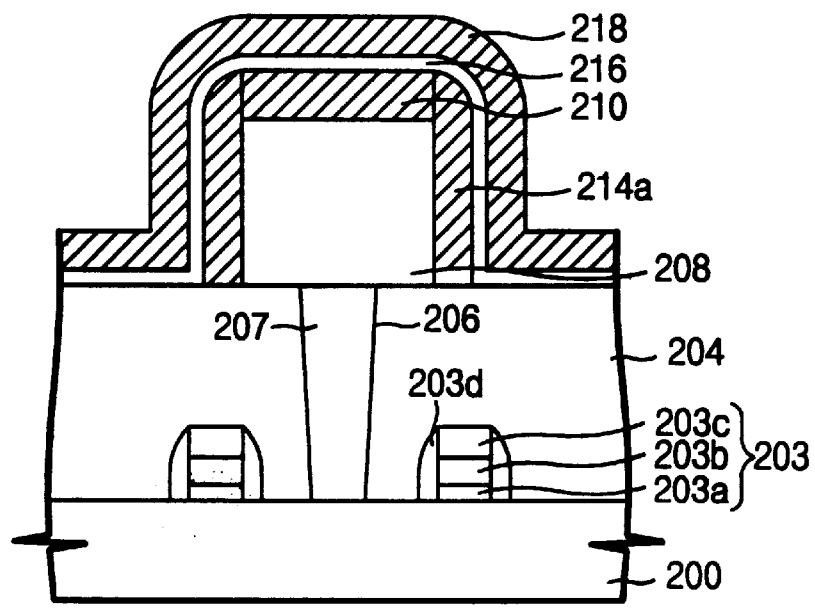

Next a high dielectric layer 216 (that is a layer of a material with a high dielectric content) and a plate node 218 are formed, thereby completing a capacitor as shown in FIG. 2D. Preferably, the high dielectric layer 216 has a thickness of about 200 Å to 1,000 Å, and the plate node 218 has a thickness of about 100 Å to 2,000 Å. Preferably, the plate node 218 may be made of a material selected from the group consisting of platinum, iridium and ruthenium.

The present invention provides a pillar-shaped storage node of a capacitor. A conductive layer that is unreactive with a high dielectric material, but is not etched easily, is provided. The conductive layer is formed thinly in order to prevent slope etching. On the other hand, a conductive material that is easily etched is formed thickly in order to further increase capacitance of the capacitor.

Thus, a semiconductor memory device having a pillar-shaped capacitor node, and a process for fabricating same has been described according to the present invention. While the invention is susceptible to various modifications and alternative forms, specific embodiments have been shown by way of example in the drawings and described in detail herein. However, it should be understood that the invention is not limited to the particular forms disclosed. Rather, the invention covers all modifications, equivalents, and alternatives falling within the spirit and scope of the invention as defined in the appended claims.

What is claimed is:

1. A method of forming a capacitor storage node, comprising:
   forming a contact plug in an insulating layer on a semiconductor substrate;
   sequentially forming a first barrier metal layer, a first conductive layer and a second barrier metal layer on the insulating layer and on the contact plug;
   forming a second conductive layer on the second barrier metal layer wherein the second conductive layer is thinner than the first conductive layer;
   etching the first barrier layer, first conductive layer, second barrier layer, and second conductive layer using an etching mask to form a storage node to be electrically connected to the contact plug;
   forming a barrier metal spacer on both sidewalls of the storage node; and
   forming a conductive spacer on both sidewalls of the barrier metal spacer.

2. The method according to claim 1, wherein forming the contact plug includes etching selected portions of the insulating layer to form a contact hole and filling the contact hole with a conductive material to form the contact plug.

3. The method according to claim 1, wherein the first and second barrier metal layers and the barrier metal spacer are made of a material selected from the group consisting of TiN, TiAlN, TiSiN, TaSiN, TaAlN, ruthenium oxide, iridium oxide, lanthanum strontium cobalt oxide and a conductive oxide of barium, strontium or ruthenium.

4. The method according to claim 1, wherein the second barrier metal layer and the barrier metal spacer have a thickness of about 100 Å to 1,000 Å.

5. The method according to claim 1, wherein the first conductive layer is made of a material selected from the group consisting of TiN, polysilicon and ruthenium.

6. The method according to claim 1, wherein the first conductive layer has a thickness of about 1,000 Å to 10,000 Å.

7. The method according to claim 1, wherein the second conductive layer and the conductive spacer are made of a material selected from the group consisting of ruthenium, platinum, iridium oxide, ruthenium oxide, lanthanum strontium cobalt oxide and a conductive oxide of barium, strontium or ruthenium.

8. The method according to claim 1, wherein the second conductive layer has a thickness of about 100 Å to 1,000 Å.

9. A method of forming a capacitor storage node, comprising:
   forming a contact plug in an insulating layer on a semiconductor substrate;
   forming a first conductive layer on the insulating layer and on the contact plug;
   forming a second conductive layer on the first conductive layer wherein the second conductive layer is at least three times thinner than the first conductive layer;
   etching the first and second conductive layers using an etching mask to form a storage node to be electrically connected to the contact plug; and
   forming a conductive spacer on both sidewalls of the storage node.

10. The method according to claim 9, wherein the first conductive layer is made of a material selected from the group consisting of TiN, TiAlN, TiSiN, TaSiN, TaAlN, ruthenium oxide, iridium oxide, lanthanum strontium cobalt oxide, and a conductive oxide of barium, strontium or ruthenium.

11. The method according to claim 9, wherein the second conductive layer and the conductive spacer are made of a material selected from the group consisting of ruthenium, platinum, iridium oxide, ruthenium oxide, lanthanum strontium cobalt oxide, and a conductive oxide of barium, strontium or ruthenium.

12. The method according to claim 9, wherein the first conductive layer has a thickness of about 1,000 Å to 10,000 Å and the second conductive layer has a thickness of about 300 Å to 2,000 Å.

13. The method according to claim 9, wherein the conductive spacer has a thickness of about 500 Å to 1,000 Å.

14. The method according to claim 1, wherein the storage node is a multilayer pillar-shaped storage node.

15. The method according to claim 9, wherein the storage node is a pillar-shaped storage node.

16. The method according to claim 9, wherein the conductive spacer is comprised of the same material as the second conductive layer.

17. The method according to claim 1, wherein the etching mask used to etch the first barrier layer, first conductive layer, second barrier layer, and second conductive layer, is prepared by:
   sequentially forming a titanium nitride layer and a silicon oxide layer on the second conductive layer; and
   patterning the titanium nitride layer and the silicon oxide layer by using a multilayer photoresist layer pattern including a bottom photoresist layer, an intermediate silicon oxide layer and a top photoresist layer.

18. The method according to claim 1, wherein etching the first barrier layer, first conductive layer, second barrier layer, and second conductive layer forms a storage node having a substantially vertical sidewall.

19. The method according to claim 1, further comprising:
   forming a high dielectric layer conformally on the substrate having the conductive spacer, whereby the high dielectric layer is selected from the group consisting of strontium titanate and barium strontium titanate.

* * * * *